(12) United States Patent
Xiong et al.

(10) Patent No.: US 9,053,966 B2
(45) Date of Patent: *Jun. 9, 2015

(54) INTEGRATED CIRCUITS WITH ALIGNED (100) NMOS AND (110) PMOS FINFET SIDEWALL CHANNELS

(71) Applicant: Texas Instruments Incorporated, Dallas, TX (US)

(72) Inventors: Weize W. Xiong, Austin, TX (US); Cloves R. Cleavelin, Lubbock, TX (US); Angelo Pinto, San Diego, CA (US); Rick L. Wise, Fairview, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/499,834

(22) Filed: Sep. 29, 2014

(65) Prior Publication Data

US 2015/0014789 A1 Jan. 15, 2015

Related U.S. Application Data

(63) Continuation of application No. 13/855,520, filed on Apr. 2, 2013, now Pat. No. 8,872,220, which is a continuation of application No. 13/425,082, filed on Mar. 20, 2012, now Pat. No. 8,410,519, which is a continuation of application No. 13/036,938, filed on Feb. 28, 2011, now Pat. No. 8,138,035, which is a continuation of application No. 11/764,442, filed on Jun. 18, 2007, now Pat. No. 7,897,994.

(51) Int. Cl.
*H01L 29/66* (2006.01)
*H01L 27/088* (2006.01)
*G11C 11/412* (2006.01)
(Continued)

(52) U.S. Cl.
CPC .......... *H01L 27/0886* (2013.01); *G11C 11/412* (2013.01); *H01L 21/823807* (2013.01); *H01L 27/0207* (2013.01); *H01L 27/11* (2013.01); *H01L 27/1104* (2013.01); *H01L 27/092* (2013.01); *Y10S 257/90* (2013.01); *Y10S 438/973* (2013.01); *Y10S 438/982* (2013.01); *H01L 21/823821* (2013.01); *H01L 27/1116* (2013.01); *H01L 29/045* (2013.01)

(58) Field of Classification Search
CPC .............. H01L 29/66; H01L 29/66053; H01L 29/66075; H01L 29/66083; H01L 29/66045; H01L 29/66015; H01L 29/66227; H01L 29/66787; H01L 29/66795
USPC ...................... 257/68, 119, 288, 900, E29.264
See application file for complete search history.

(56) References Cited

U.S. PATENT DOCUMENTS 7,087,493 B1 8/2006 Madan
2007/0052027 A1 3/2007 Ke et al.
(Continued)

*Primary Examiner* — Mohammad Islam
*Assistant Examiner* — Joannie A Garcia
(74) *Attorney, Agent, or Firm* — Jacqueline J. Garner; Frank Cimino

(57) ABSTRACT

An integrated circuit device that includes a plurality of multiple gate FinFETs (MuGFETs) is disclosed. Fins of different crystal orientations for PMOS and NMOS MuGFETs are formed through amorphization and crystal regrowth on a direct silicon bonded (DSB) hybrid orientation technology (HOT) substrate. PMOS MuGFET fins are formed with channels defined by fin sidewall surfaces having (110) crystal orientations. NMOS MuGFET fins are formed with channels defined by fin sidewall surfaces having (100) crystal orienations in a Manhattan layout with the sidewall channels of the different PMOS and NMOS MuGFETs aligned at 0° or 90° rotations.

2 Claims, 5 Drawing Sheets

(51) Int. Cl.
*H01L 21/8238* (2006.01)
*H01L 27/02* (2006.01)
*H01L 27/11* (2006.01)
*H01L 27/092* (2006.01)
*H01L 29/04* (2006.01)

(56) References Cited

U.S. PATENT DOCUMENTS

2008/0079003 A1 4/2008 Shaheen et al.
2008/0203447 A1 8/2008 Arnold et al.
2008/0303068 A1 12/2008 Grill et al.

US 9,053,966 B2

INTEGRATED CIRCUITS WITH ALIGNED (100) NMOS AND (110) PMOS FINFET SIDEWALL CHANNELS

CROSS REFERENCE TO RELATED APPLICATIONS

This application is a continuation of application Ser. No. 13/855,520 filed Apr. 2, 2013, which is a continuation of application Ser. No. 13/425,082, filed Mar. 20, 2012 (now Pat. No. 8,410,519), which is a continuation of application Ser. No. 13/036,938, filed Feb. 28, 2011 (now Pat. No. 8,138,035), which is a continuation of application Ser. No. 11/764,442, filed Jun. 18, 2007 (now Pat. No. 7,897,994), the entireties of all which are hereby incorporated by reference.

BACKGROUND

This relates to methods of fabricating semiconductor devices with field effect transistors having gates that straddle fins of channel forming material (so-called FinFETs).

Conventional integrated circuit devices, such as SRAM devices, have NMOS and PMOS fin field effect transistors (FinFETs) with different channel crystal orientations laid out in a non-aligned fin layout (referred to as a "non-Manhattan" layout). Adjacent fins of different conductivity type are rotated by 45° to accommodate for the different crystal orientations of the substrate surfaces.

FIG. 1 (Prior Art) illustrates a conventional layout for a multiple gate FinFET (MuGFET) device 100. As shown, MuGFET 100 has a semiconductor material fin 130 straddled by a saddle-like gate 120. The fin 110 and gate 120 are formed on an oxide layer 140 (e.g., $SiO_2$) formed on a semiconductor substrate. The channels for MuGFET 100 are located on the sidewalls 150 of the fin 130. For a usual <110> notch (001) surface wafer, the sidewall 150 of the fin 130 has a (110) crystal orientation if fin 130 is laid out at 0° or 90° rotation with respect to the notch. If the rotation of the fin 130 is laid out at 45° with respect to the notch, the fin 130 sidewalls 150 will have a (100) crystal orientation.

A (110) crystal orientation surface is good for channel hole mobility but poor for channel electron mobility, while the (100) crystal orientation channel surface is poor for channel hole mobility but good for channel electron mobility. Thus, a (110) sidewall orientation is a preferred orientation for PMOS MuGFETs and a (100) sidewall orientation is a preferred orientation for NMOS MuGFETs. To provide preferred surface orientations for PMOS and NMOS MuGFETs on the same substrate, conventional fabrication methods use mixed rotations of the fins 130 of 0° (or 90°) and 45°. Such mixed rotations require increases in layout area of an integrated circuit device by approximately 25% and increase lithography difficulties.

FIG. 2A (Prior Art) illustrates a top view of an example non-Manhattan layout design of a conventional SRAM storage cell which uses both PMOS and NMOS FinFETs. As shown, SRAM storage cell 200 has a plurality of fins 210 with runs of 0° and 45° rotations straddled by gates 220. Fins 210 have enlarged pad portions away from the gates 220 which provide locations for connection to source/drain regions by contacts 215. Gates 220 have enlarged pad portions away from the fins 210 for connection to gate electrodes by contacts 225. Using industry standards for spacing between components and measurements taken between centers of outside contact points of contacts 215, 225, the example conventional layout for SRAM storage cell 200 shown in FIG. 2 occupies a layout area of approximately 500 nm by approximately 812.5 nm, or approximately 406,250 $nm^2$. (Elements of the layout for storage cell 200 given in FIG. 2A are marked to show correspondence with source/drains S, D or S/D and gates G of pull-up transistors PT1, PT2, drive transistors DT1, DT2 and access transistors AT1, AT2 of a typical storage cell schematic diagram such as given in FIG. 1b of U.S. Pat. No. 7,087,493 which is reproduced as FIG. 2B herein.)

SUMMARY

Embodiments described herein relate to methods for forming integrated circuit devices having fin field effect transistors (FinFETs) with different channel surface crystal orientations arranged in parallel or perpendicular alignment.

In a described example, an integrated circuit in the form of an example SRAM storage cell implementation has a first fin with a (110) crystal orientation sidewall defining a transistor channel of a PMOS FinFET in parallel alignment with a transistor channel of an NMOS FinFET defined by a second fin having a (100) crystal orientation sidewall.

The described methods enable PMOS FinFETs and NMOS FinFETs to be laid out in Manhattan layouts, i.e., fins rotated with respect to notches at 0° and 90°. By avoiding 45° rotations, substrate area requirements for mixed NMOS and PMOS FinFET layouts can be minimized. Moreover, enabling use of Manhattan layouts having 0° and 90° rotations simplifies photolithography processes used for fabrication.

DESCRIPTION OF EXAMPLE EMBODIMENTS

Example embodiments of the invention are described for illustrative purposes, with reference to FIGS. 3-6, in a context of a method of forming an integrated circuit device having PMOS and NMOS multiple gate FinFETs (MuGFETs) with aligned fins of different channel surface crystal orientations.

Figure 3:
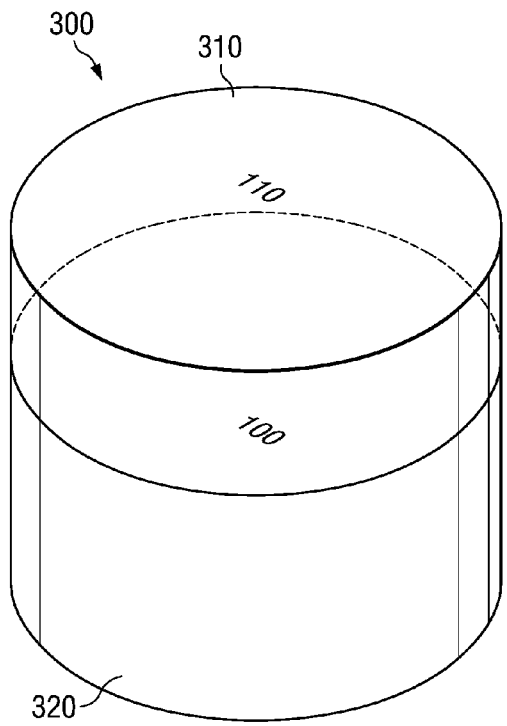
FIGS. 3-6 illustrate steps in an example method of forming an integrated circuit device having FinFETs with different channel surface crystal orientations in accordance with principles of the invention.

FIG. 3 shows a step of providing a direct silicon bonded (DSB) substrate 300 having an upper silicon layer 310 with a (110) crystal orientation top surface over a lower silicon substrate 320 with a (100) crystal orientation top surface. The upper silicon layer 310 includes the (110) top surface by virtue of its crystalline structure and the lower silicon substrate 320 includes the (100) top surface by virtue of its crystalline structure. The DSB substrate 300 may be created using conventional techniques for creating a DSB substrate 300.

Figure 4:
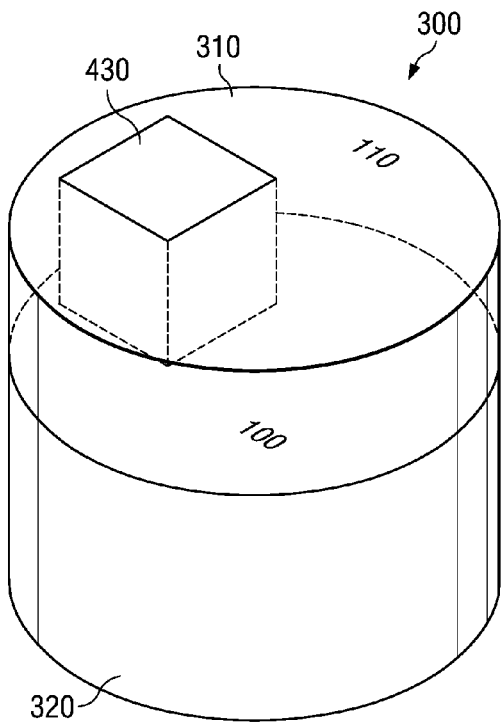

FIG. 4 shows a later step wherein the DSB substrate 300 of FIG. 3 has been processed using conventional photomask/ hard mask and etching patterning techniques followed by an amorphization implant to selectively amorphize a PMOS region 430 of the crystalline structure of upper silicon layer 310. The crystalline structures of the lower silicon substrate 320 and remaining portions of the upper silicon layer 310 outside the PMOS region 430 are not implanted during the PMOS region amorphization implant, so remain the same.

Figure 5:
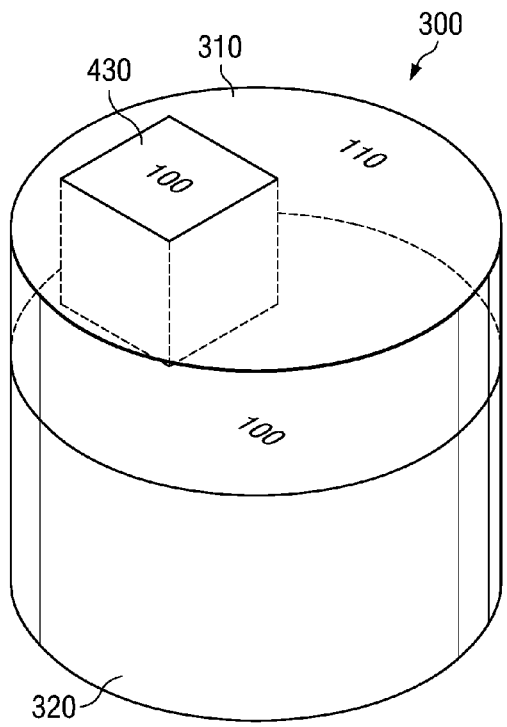

FIG. 5 shows a later step wherein the DSB substrate 300 of FIG. 4 has been further processed to regrow and recrystallize the amorphized silicon within the amorphorized PMOS region 430 of upper silicon layer 310. The amorphized silicon is regrown using the underlying crystalline structure of the lower silicon substrate 320 as a template, thereby giving the recrystallized PMOS region 430 a (100) crystal orientation top surface. The crystalline structures of the lower silicon substrate 320 and the remaining portions of the upper silicon layer 310 outside the PMOS region 430 are not regrown and recrystallized during the regrowth and recrystallization of the amorphorized PMOS region 430, so remain the same.

Figure 6:
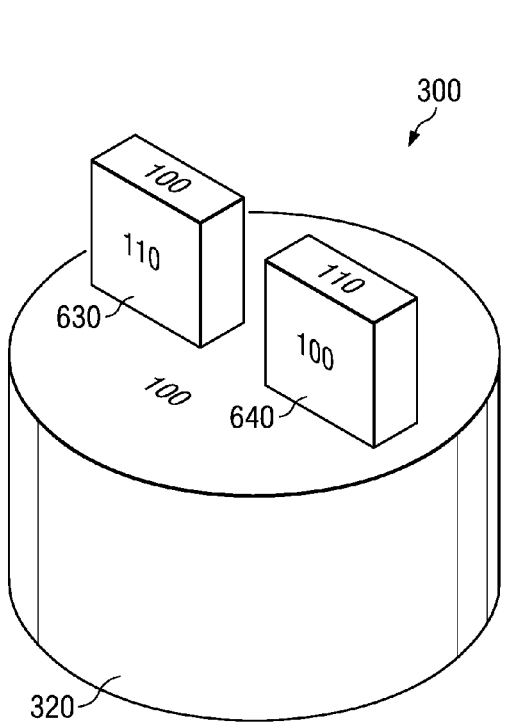

FIG. 6 shows a later step wherein the DSB substrate 300 of FIG. 5 has been further processed using conventional photomask/hard mask and etching patterning techniques to pattern the recrystallized PMOS region 430 and unrecrystallized remaining portions of the upper silicon layer 310 to form adjacent fins 630, 640 having sidewall surfaces of different crystal orientations laid out in general parallel planar alignment. The patterning removes parts of the recrystallized PMOS region 430 and remaining portions of the upper silicon layer 310 from around the fin 630 to define a PMOS FinFET fin including a (110) crystal orientation sidewall channel and a (100) crystal orientation top surface. The patterning also removes parts of the remaining portions of the upper silicon layer 310 from around the fin 640 to define an NMOS FinFET fin including a (100) crystal orientation sidewall channel and a (110) crystal orientation top surface.

Thus, as described, using a hybrid orientation technology (HOT) direct silicon bonded (DSB) substrate 300 wherein the silicon DSB layer 310 has a (110)-oriented crystal top surface and the silicon wafer substrate 320 has a (100)-oriented top surface, PMOS FinFET regions in the DSB layer 310 may be amorphized and regrown to form PMOS multiple gate FinFETs (MuGFETs) having (100)-oriented top surfaces and (110)-oriented sidewalls providing sidewall channels with hole mobility in the <110> direction in general parallel or perpendicular (0° or 90°) alignment with channels for electron mobility in the <100> direction provided by NMOS MuGFETs formed in unamorphized regions having (110)-oriented top surfaces and (100)-oriented sidewalls.

Figure 1:
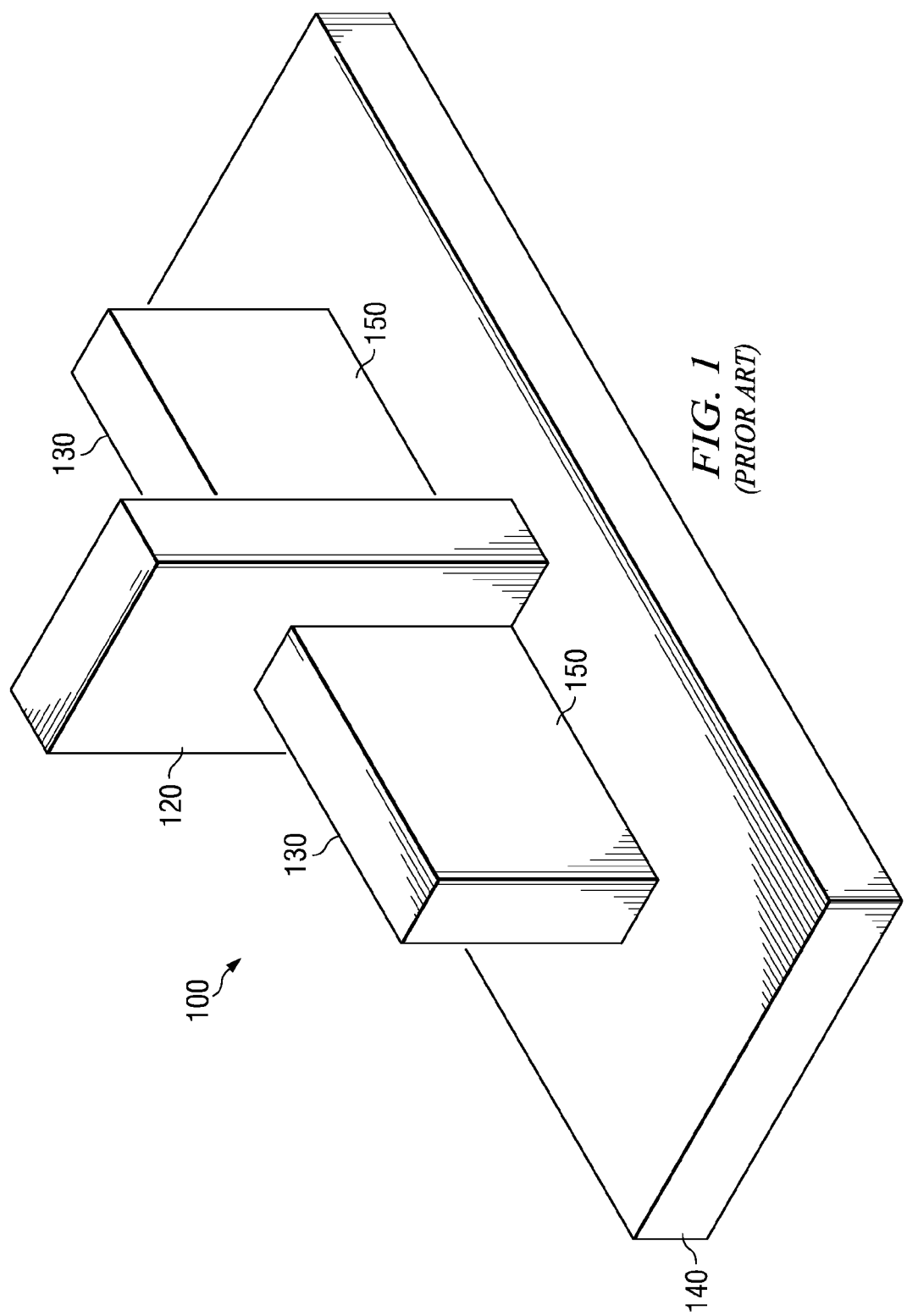
FIG. 1 (Prior Art) is a perspective view of a conventional fin field effect transistor (FinFET) device.
Figure 2A:
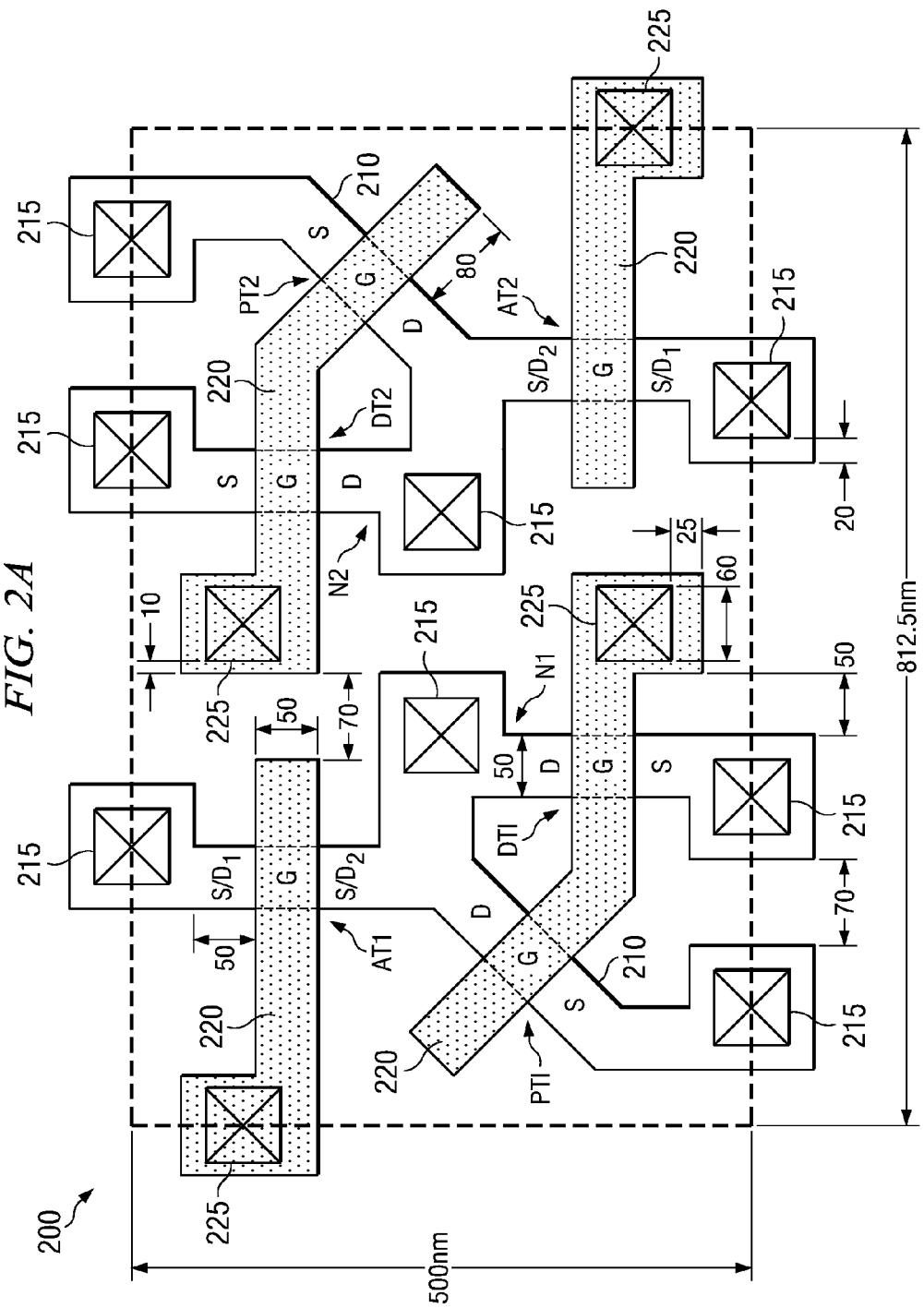
FIG. 2A (Prior Art) is a top view of an example conventional non-Manhattan layout of an SRAM storage cell utilizing FinFETs of the type shown in FIG. 1 having different channel surface crystal orientations.
Figure 2B:
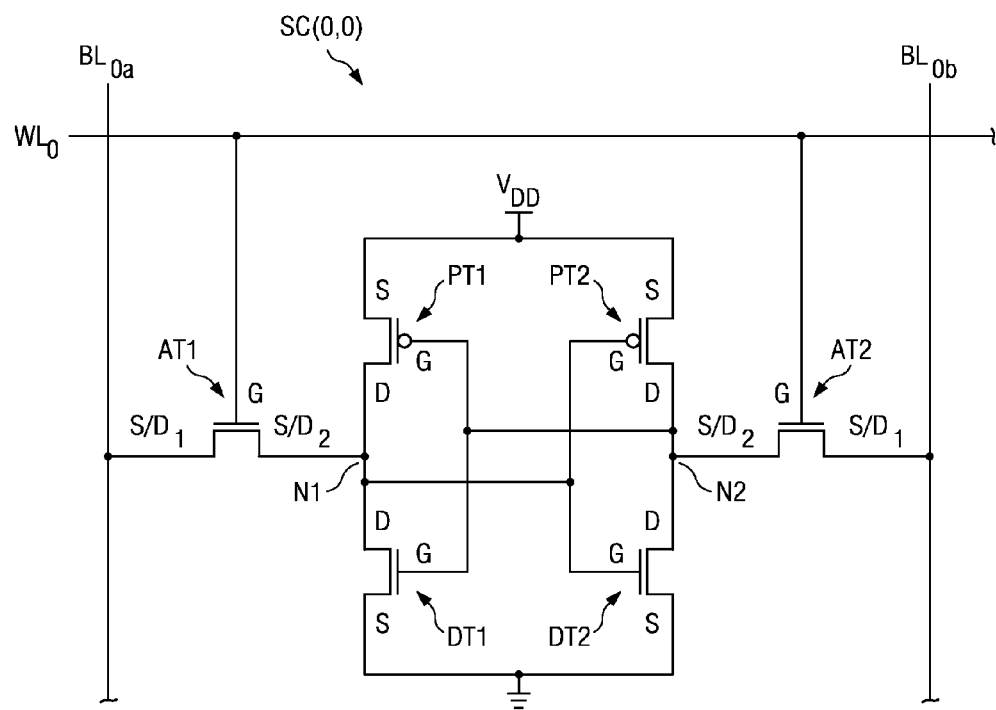
FIG. 2B (Prior Art) is a schematic diagram of a conventional SRAM storage cell as given in FIG. 1b of U.S. Pat. No. 7,087,493.
Figure 7:
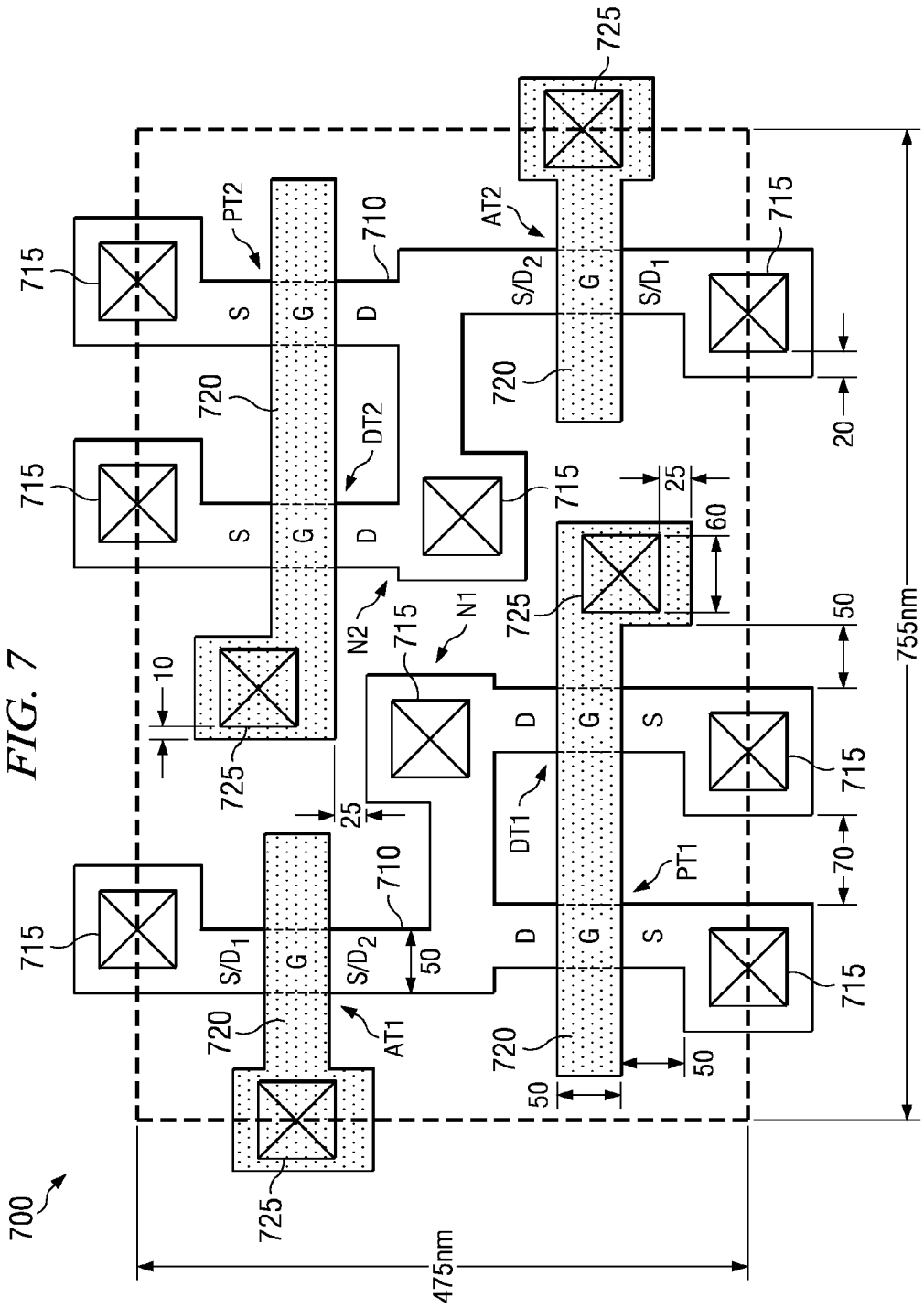
FIG. 7 is a top view of an example Manhattan layout of an example SRAM storage cell utilizing FinFETs formed in accordance with the principles of the invention.

FIG. 7 illustrates a top view of an example Manhattan layout design of an SRAM storage cell 700 having a plurality of fins 710 straddled by gates 720. Fins 710 have enlarged pad portions away from the gates 720 which provide locations for connection to source/drain regions by contacts 715. Gates 720 have enlarged pad portions away from the fins 710 for connection to gate electrodes by contacts 725. As for the layout of fins 210 of SRAM storage cell 200 shown in FIG. 2, fins 710 preferably have different sidewall crystal orientations for defining the channels of PMOS FinFETs and NMOS FinFETs. However, in contrast to the fins 210 of SRAM storage cell 200, the layout of SRAM storage cell 700 may be accomplished without the necessity for rotating the different crystal orientation sidewall fins 710 at 45° relative to each other. In the SRAM storage cell 700, the fins 710 can be laid out with fins 710 of different sidewall crystal orientations in 0° or 90° alignment. Fins 710 for PMOS FinFETs may be formed as described above for patterned fins 630 and fins 710 for NMOS FinFETs may be formed as described above for patterned fins 640.

Using industry standards for spacing between components and measurements taken between centers of outside contact points of contacts 715, 725, the example layout for SRAM storage cell 700 shown in FIG. 7 occupies a layout area of approximately 475 nm by approximately 755 nm, or approximately 358,625 nm². This provides a 47,625 nm² (or approximately 25% reduction) in area over the 406,250 nm² area of the conventional layout shown in FIG. 2. (As for the layout for the storage cell 200 given in FIG. 2, elements of the layout for storage cell 700 given in FIG. 7 are marked to show correspondence with source/drains S, D or S/D and gates G of pull-up transistors PT1, PT2, drive transistors DT1, DT2 and access transistors AT1, AT2 of the storage cell schematic diagram of FIG. 2B.)

The principles disclosed herein apply equally to forming fins of NMOS FinFETs with (110)-oriented sidewall surfaces (<110> channel direction) and (100)-oriented top surfaces and to forming fins of PMOS FinFETs with (100)-oriented sidewall surfaces (<100> channel direction) and (110)-oriented top surfaces on a common substrate having the (110)-oriented top surface DSB layer at 0° and 90°. Incorporating a PMOS FinFET having a (100)-oriented sidewall surface on a common substrate with an NMOS FinFET also having a (100) crystal orientation sidewall surface might be done, for example, when it is considered advantageous to have a weak PMOS transistor and a strong NMOS transistor for an SRAM write operation.

The same principles may also be applied to a hybrid orientation technology (HOT) direct silicon bonded (DSB) substrate 300 having a (100)-oriented top surface upper layer over a (110)-oriented top surface wafer substrate. In such case, a region of the upper layer is amorphized and regrown to have a (110)-oriented top surface crystal orientation, with unamorphized portions left with the original (100)-oriented top surface.

The same principles may also be applied to a DSB substrate having same (100)-oriented top surfaces on both the upper silicon layer and the lower silicon substrate. In such case, the DSB top layer's notch is rotated by 45° relative to the DSB substrate, placing the NMOS FinFET channel direction in a <100> direction instead of a <110> direction, prior to further processing as disclosed above.

Moreover, the principles disclosed herein also make a (111)-oriented surface accessible by aligning a fin layout to a <112> direction on a (110)-oriented substrate surface. All three primary crystal surfaces are accessible to semiconductor devices using the principles disclosed herein.

Although the example disclosed herein is applied to a DSB substrate, the teachings disclosed herein may also be applied to other hybrid orientation substrates having a (110) crystal orientation on surface layer and a (100) crystal orientation surface layer.

Those skilled in the art to which the invention relates will appreciate that modifications to the above embodiments and additional embodiments are possible within the scope of the claimed invention.

What is claimed is:
1. An integrated circuit device, comprising:
a lower silicon layer having a top surface with a first crystal orientation;
an upper silicon layer on the lower silicon layer having a first portion with a top surface of a second crystal orien- tation different from the first crystal orientation and a second portion with the top surface of the first crystal orientation;

a first fin in the second portion of the upper substrate, the first fin having a top surface with a first crystal orientation and a sidewall surface with a second crystal orientation; and a second fin in the first portion of the upper substrate, the second fin having a top surface with the second crystal orientation and a sidewall surface with the first crystal orientation;

the first fin sidewall surface defining a channel with a first carrier flow direction of a first FinFET, the second fin sidewall defining a channel with a second carrier flow direction of a second FinFET, and the second carrier flow direction being different than the first carrier flow direction.

2. The integrated circuit device of claim 1, wherein the first crystal orientation is (100) and the second crystal orientation is (110).

\* \* \* \* \*